United States Patent [19]

McCandless et al.

[11] Patent Number: 4,709,466

[45] Date of Patent: Dec. 1, 1987

[54] PROCESS FOR FABRICATING THIN FILM PHOTOVOLTAIC SOLAR CELLS

[75] Inventors: Brian E. McCandless; Robert W. Birkmire, both of Newark, Del.

[73] Assignee: The University of Delaware, Newark, Del.

[21] Appl. No.: 723,054

[22] Filed: Apr. 15, 1985

[51] Int. Cl.[4] .......................................... H01L 31/18
[52] U.S. Cl. ...................................... 437/5; 136/260; 136/264; 427/76; 437/248
[58] Field of Search ................. 29/572; 136/260, 264, 136/265; 357/30; 427/76

[56] References Cited

FOREIGN PATENT DOCUMENTS 58-18969  2/1983  Japan .................................. 136/260

OTHER PUBLICATIONS

H. Matsumoto et al., *Japanese J. Appl. Phys.*, vol. 21, pp. 800–801, (1982).

Y. Y. Ma et al., *Appl. Phys. Lett.*, vol. 30, pp. 423–424, (1977).

H. Matsumoto et al., *Solar Cells*, vol. 11, pp. 367–373, (1984).

S. Ikegami et al., *Proceedings, 5th E.C. Photovoltaic Solar Energy Conf.*, (1983), pp. 740–745, Reidel Pub. Co., (1984).

B. M. Basol et al., *Proceedings, 5th E.C. Photovoltaic Solar Energy Conf.*, (1983), pp. 888–891, Reidel Pub. Co., (1984).

*Primary Examiner*—Aaron Weisstuch
*Attorney, Agent, or Firm*—Connolly & Hutz

[57] ABSTRACT

Thin film photovoltaic solar cells are made by forming the cell structure from a number of layers including the contact layers and semiconductor layers. At least one of the semiconductor layers is a tellurium containing II-VI compound. After the structure is formed, it is heated to temperatures above 300° C. and then rapidly cooled at rates greater than 10° C./s. Cells comprising CdS and CdTe have increased fill factor when the fabrication process includes heating and rapid cooling.

10 Claims, 2 Drawing Figures

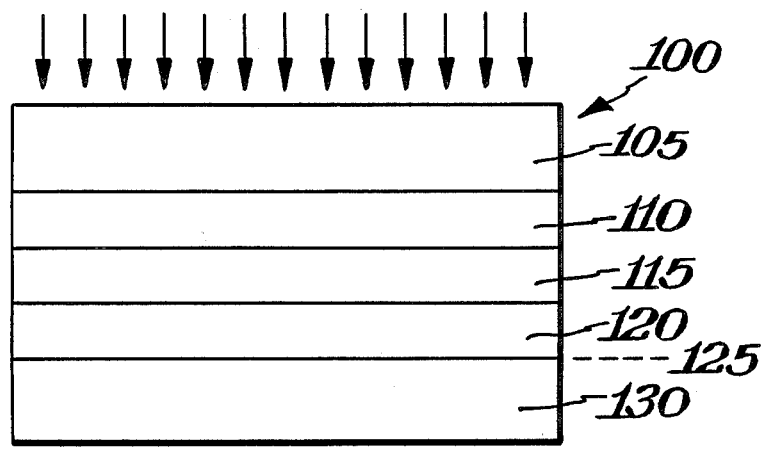

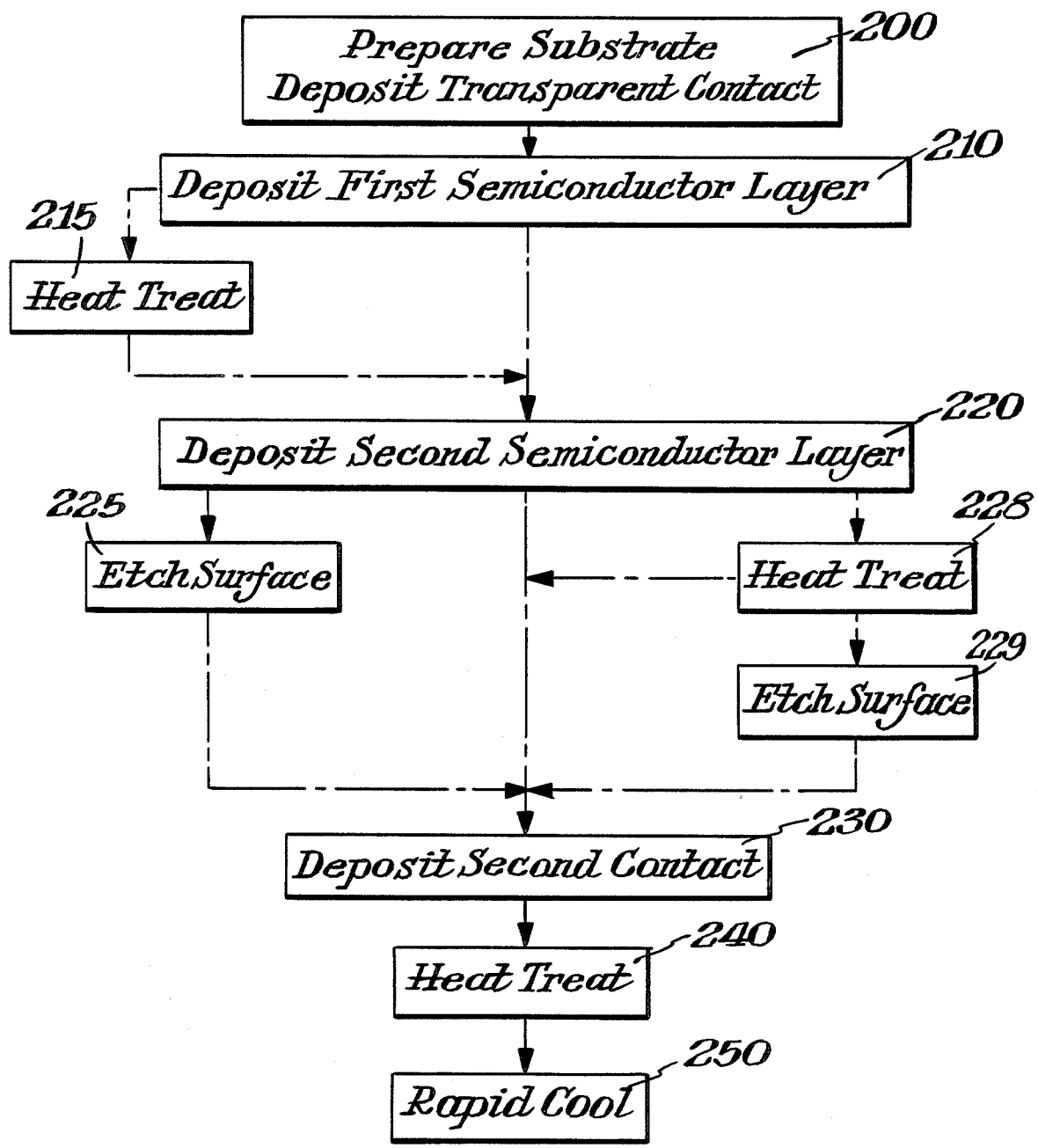

PROCESS FOR FABRICATING THIN FILM PHOTOVOLTAIC SOLAR CELLS

BACKGROUND OF THE INVENTION

While thin film solar cells, such as CdS/CdTe solar cells, made according to methods known in the art have achieved efficiencies near 10%, further improvements in efficiency require increased fill factor. In order to increase the fill factor of a cell the electrical resistance at the contact between the CdTe semiconductor layer and the contact layer needs to be reduced. A measure of this resistance is the slope of the current-voltage curve at the open circuit voltage point. Moreover, high efficiencies have been mostly obtained using gold for the contact metal. However, gold is not only an expensive material, but there is evidence that cells utilizing gold contacts are not stable for long periods of time. Therefore, there is a need for a fabrication process that provides for increased fill factor and permits substitution for gold with other metals. The art also teaches various etches for preparing the surface of CdTe before forming the contact. However, wet etching may not always be desirable or feasible for fabricating thin film cells.

SUMMARY OF THE INVENTION

An object of this invention is to provide a process for fabricating thin film photovoltaic solar cells, such as of the CdS/CdTe type, wherein there is an increase in fill factor.

In accordance with this invention, the object of the invention is achieved by heat treating the cell after the contact layer has been deposited on the CdTe layer and then rapidly cooling the cell.

THE DRAWINGS

FIG. 1 is a side elevation view of a thin film photovoltaic solar cell formed in accordance with this invention; and FIG. 2 is a flow diagram showing the steps used in fabricating the cell of FIG. 1.

DETAILED DESCRIPTION

FIG. 1 shows a thin film photovoltaic solar cell 100 fabricated in accordance with this invention. As shown therein, cell 100 includes a transparent substrate 105 on which is formed a transparent contact layer 110. Transparent substrate 105 may be glass or a polymeric material. Transparent contact layer 110 is tin oxide, indium-tin-oxide, cadmium stannate or other transparent conductive oxide materials known in the art.

Next is formed first semiconductor layer 115 and then second semiconductor layer 120. Semiconductor layers 115 and 120 should be of opposite conductivity tyep. For example, first semiconductor layer 115 may be n-type CdS or (ZnCd)S and second semiconductor layer 120 may be p-type CdTe or HgCdTe. Finally contact layer 130 is formed. The specific materials and dimensions for the cell structure may be those conventionally used in the art.

FIG. 2 shows the steps for forming cell 100. Steps 200 through 230 are carried out in the conventional manner. As indicated in FIG. 2, certain of the heating and etching steps (i.e., Steps 215, 225, 228 and 229) are optional steps.

Reference is made to the publication of Y.S. Tyan et al in *Proceedings of the 16th IEEE Photovoltaic Specialists Conference* (1983), p. 794, for Steps 210 and 220 of depositing CdS layer 115 and CdTe layer 120 in an oxygen-containing atmosphere at high temperatures using a method called "close space sublimation". Step 225 is chemically etching CdTe surface 125 as taught in U.S. Pat. No. 4,319,019. The cell is completed by depositing, in Step 230, a metal layer 130, such as gold or nickel.

Reference is made to U.S. Pat. No. 4,456,630 and the publication of B. M. Basol, in the Journal Applied Physics, Vol. 55, No. 2, (1984), p. 601 for the steps involving electrodepositing CdS and CdTe semiconductor layers 115 and 120 (Steps 210 and 220); heat treating at 400° C.in air for about 10 minutes (Step 228), followed by etching CdTe surface 125 (Step 229); and finally depositing a conductive metal layer 130, such as gold, by evaporative techniques (Step 230).

The improved process of the present invention includes, as Step 240, heating at a temperature of about 300° C. to 500° C. for about 10 to 100 minutes and Step 250 rapidly cooling to room temperature at a rate of at least 10° C./s and preferably at 100° C./s. Heating Step 240 can be carried out in an oven or furnace or on a heated surface, such as a hot plate. It is preferred to carry out Step 240 in air at a temperature of 400° C. for 15 minutes. Rapid cooling, Step 250, is carried out by removing the device from the furnace and placing it in thermal contact with a heat sink adapted to provide the required cooling rate.

Experiments have been conducted to show the utility of heating and rapid cooling. These experiments were performed by first sputter depositing an indium-tin-oxide TCO layer 110 on Corning 7059 glass substrate 105 (Step 200). Next, the CdS layer 115 was deposited to a thickness of 5 microns by physical vapor deposition (Step 210). The specimen was heat treated (Step 215) for 3 hours in air at 350° C. CdTe layer 120 was deposited in Step 220 to a thickness of 10 microns by close space sublimation in the presence of 2 torr oxygen and at a substrate temperature of 600° C. CdTe surface 125 was etched (Step 225) according to U.S. Pat. No. 4,456,630. A gold metal contact 130 was deposited in Step 230 by electron beam evaporation. Heating Step 240 was conducted by placing the cell in the 400° C. zone of a quartz lined tube furnace for 15 minutes. Finally, rapid cooling Step 250 was carried out at an estimated rate of 100° C./s by removing the cell from the furnace and pressing it against a precooled aluminum plate.

Comparative experiments were also carried out. In order to test the effect of cooling rate, specimens were cooled slowly. The effect of heating and quick cooling prior to depositing metal layer 130 was also examined.

It was found that rapid cooling gave higher fill factor and that the effect was essentially reversible with respect to slow cooling. That is, when a cell made in accordance with the invention and having a fill factor of 0.53 was heated for 15 minutes in air at 400° C.and allowed to cool slowly at a rate of less than 1° C./s, the fill factor diminished by 14% to 0.46. However, when the same cell was reheated and cooled rapidly at a rate of about 100° C./s , the fill factor was found to increase some 15% to a new value of 0.54. Examination of the current-voltage characteristics of this cell after each heating and cooling cycle confirmed that the observed changes in fill factor were due to changes in series resistance. Furthermore, changes in open circuit voltage and short circuit current were negligible.

Regarding the significance of carrying out Steps 240 and 250 after metal deposition Step 230, it was found that air heating Step 228 merely functioned as taught by the above noted Basol publication. The degree of effectiveness depended on the conditions of CdTe deposition Step 220. For example, heating in air prior to depositing metal contact layer 130 was more beneficial for cells having CdTe deposited in an argon atmosphere than for CdTe deposited in an oxygen atmosphere. In either case, however, the rate of cooling had no effect. In contrast, heat treating and rapid cooling after contact deposition Step 230, in accordance with the invention, always improved fill factor.

It was also found that etching Steps 225 or 229 can be omitted when the cell is heated and rapidly cooled according to the invention.

These observations are consistent with the hypothesis that heating and rapid cooling act to improve the electrical properties of the CdTe/metal contact.

It is believed that the scientific principle governing the invention is related to the phase equilibria of CdTe. Examination of the phase diagram in W. Abers, "Physical Chemistry of Defects", *Physics and Chemistry of II-VI Compounds*, M. Aven and J. S. Prenner, eds. American Elsevier, N.Y. (1967) shows that the single phase region for CdTe is quite broad at temperatures above 400° C., but narrows rapidly at lower temperatures. The implication of this is that slightly non-stoichiometric CdTe will contain precipitates of Cd or Te if equilibrated at low temperatures. Rapid cooling, however, will "freeze in" the high temperature equilibrium.

The process of the invention has also been applied to cells having a structure which is the inverse of that shown in FIG. 1. Such a cell would be fabricated by first depositing the CdTe on a suitable substrate, optionally heat treating the CdTe, next depositing CdS, and finally depositing a transparent conductive layer onto the CdS. Positive results were indicated when a cell having the configuration glass/metal/CdTe/CdS/ITO, with the semiconductor layers deposited by physical vapor deposition, was heat treated and rapidly cooled in accordance with the teachings of the invention.

Substitution by (ZnCd)S for CdS and/or by (HgCd)Te or (ZnCd)Te for CdTe are within the scope of the invention. Moreover, the practice of the invention need not be limited by the method selected for depositing the semiconductor and contact layers. Among deposition methods that may be selected by one skilled in the art are: physical vapor deposition; close space transport; close space sublimation; sputtering; chemical vapor deposition; electrodeposition; screen printing; electrophoresis; spray pyrolysis; electron beam evaporation; ion plating; and liquid phase epitaxy.

Furthermore, it is contemplated that heating and rapid cooling in accordance with the teachings of this invention may be adapted by those skilled in the art for improving the electrical contact behavior of devices utilizing Te containing II-VI compound semiconductors such as tandem photovoltaic solar cells, optical and infrared detectors, photoemissive displays, light emitting diodes, thin film transistors and the like.

What is claimed is:

1. In a method of fabricating thin film photovoltaic solar cells made by sequentially forming a first contact layer on a substrate, a first semiconductor layer, and a second semiconductor layer, and a second contact layer, wherein at least one of the contact layers is transparent and at least one of the semiconductor layers comprises a tellurium containing II-VI compound the improvement being the steps of heat treating the cell after the second contact layer has been formed, and then rapidly cooling the cell at a temperature reduction rate of at least 10° C. per second.

2. In the method of claim 1 wherein the heat treating step is at a temperature of from 300° C. to 500° C. for a period of time from 10 minutes to 100 minutes.

3. In the method of claim 2 wherein the heat treating step is at 400° C. for about 15 minutes.

4. In the method of claim 2 wherein the rapid cooling step results in a temperature reduction of 100° C. per second.

5. In the method of claim 2 wherein the heat treating step is performed in air.

6. The method of claim 2 wherein the rapid cooling step is performed by placing the cell in thermal contact with a heat sink.

7. The method of claim 1 wherein one of the semiconductor layers is selected from the group consisting of CdTe, (HgCd)Te and (ZnCd)Te.

8. In the method of claim 8 wherein said one of the semiconductor layers is CdTe.

9. The method of claim 8 wherein the other semiconductor layer selected from the group consisting of CdS and (ZnCdS).

10. The method of claim 10 wherein said other semiconductor is CdS.

* * * * *

UNITED STATES PATENT AND TRADEMARK OFFICE
CERTIFICATE OF CORRECTION

PATENT NO. : 4,709,466

DATED : December 1, 1987

INVENTOR(S) : Brian E. McCandless and Robert W. Birkmire

It is certified that error appears in the above-identified patent and that said Letters Patent is hereby corrected as shown below:

Col. 4, lines 42 and 44 "8" should be --7--;

Col. 4, line 47 "10" should be --9--.

Signed and Sealed this

Sixth Day of September, 1988

Attest:

DONALD J. QUIGG

Attesting Officer

Commissioner of Patents and Trademarks